United States Patent [19]

Schoppmeyer

[11] Patent Number: 4,537,470

[45] Date of Patent: Aug. 27, 1985

[54] SCREEN SYSTEMS FOR MULTICOLOR PRINTING

[75] Inventor: Johannes Schoppmeyer, St. Augustin, Fed. Rep. of Germany

[73] Assignee: Dr.-Ing. Rudolf Hell GmbH, St. Augustin, Fed. Rep. of Germany

[21] Appl. No.: 438,989

[22] Filed: Nov. 4, 1982

[30] Foreign Application Priority Data

Nov. 20, 1981 [EP] European Pat. Off. .......... 81109796.3

[51] Int. Cl.³ .................................................. G02B 5/22
[52] U.S. Cl. ...................................... 350/317; 358/75
[58] Field of Search ...................... 350/315, 316, 317; 358/75

[56] References Cited

U.S. PATENT DOCUMENTS 3,085,878  4/1963  Archer ................................. 350/316
4,342,046  7/1982  Kamata ................................ 350/317

Primary Examiner—John K. Corbin
Assistant Examiner—P. M. Dzierzynski
Attorney, Agent, or Firm—Brisebois & Kruger

[57] ABSTRACT

This invention relates to a screen system for color reproduction wherein screens differing in angle and screen line spacing from color separation to color separation are utilized in each case in the individual color separations. Special screens are specified, whereof the tolerance ranges are situated at 2° for the angles and at approximately 12% for the screen fineness.

9 Claims, 7 Drawing Figures

Fig. 1a (PRIOR ART)
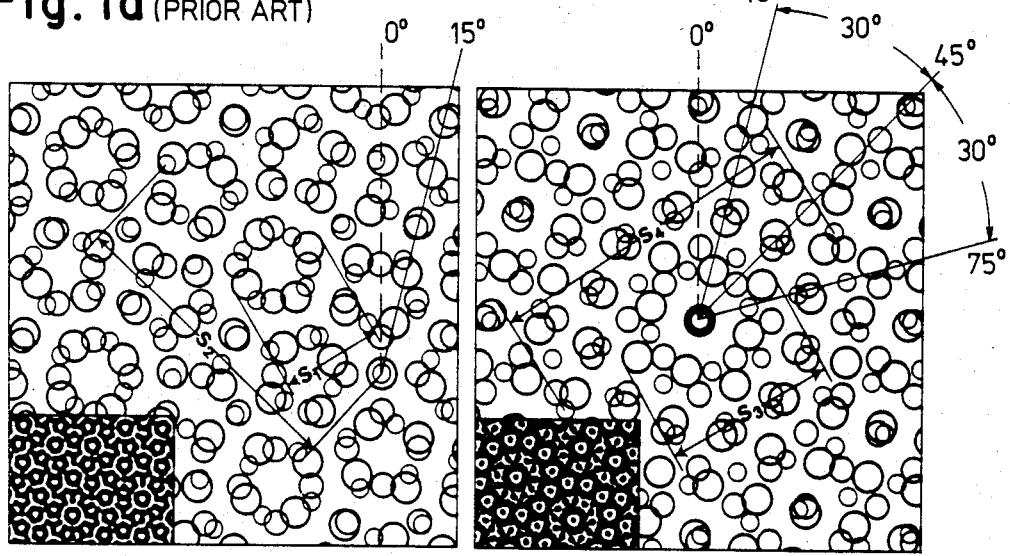
Fig. 1b (PRIOR ART)
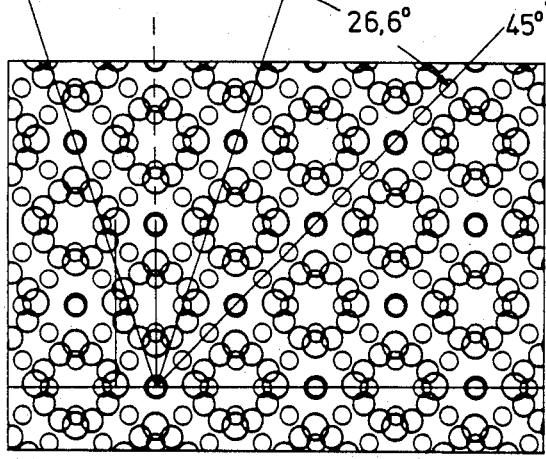
Fig. 2a (PRIOR ART)
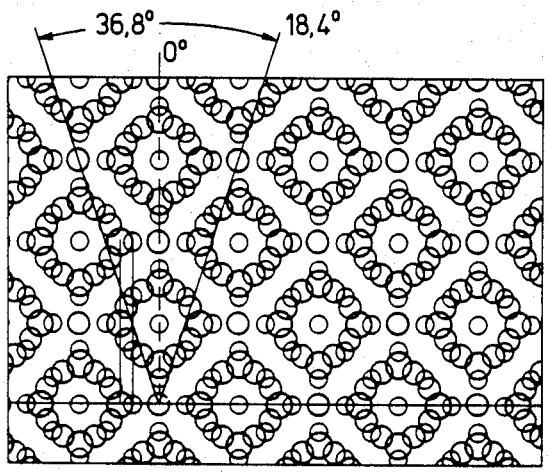
Fig. 2b (PRIOR ART)

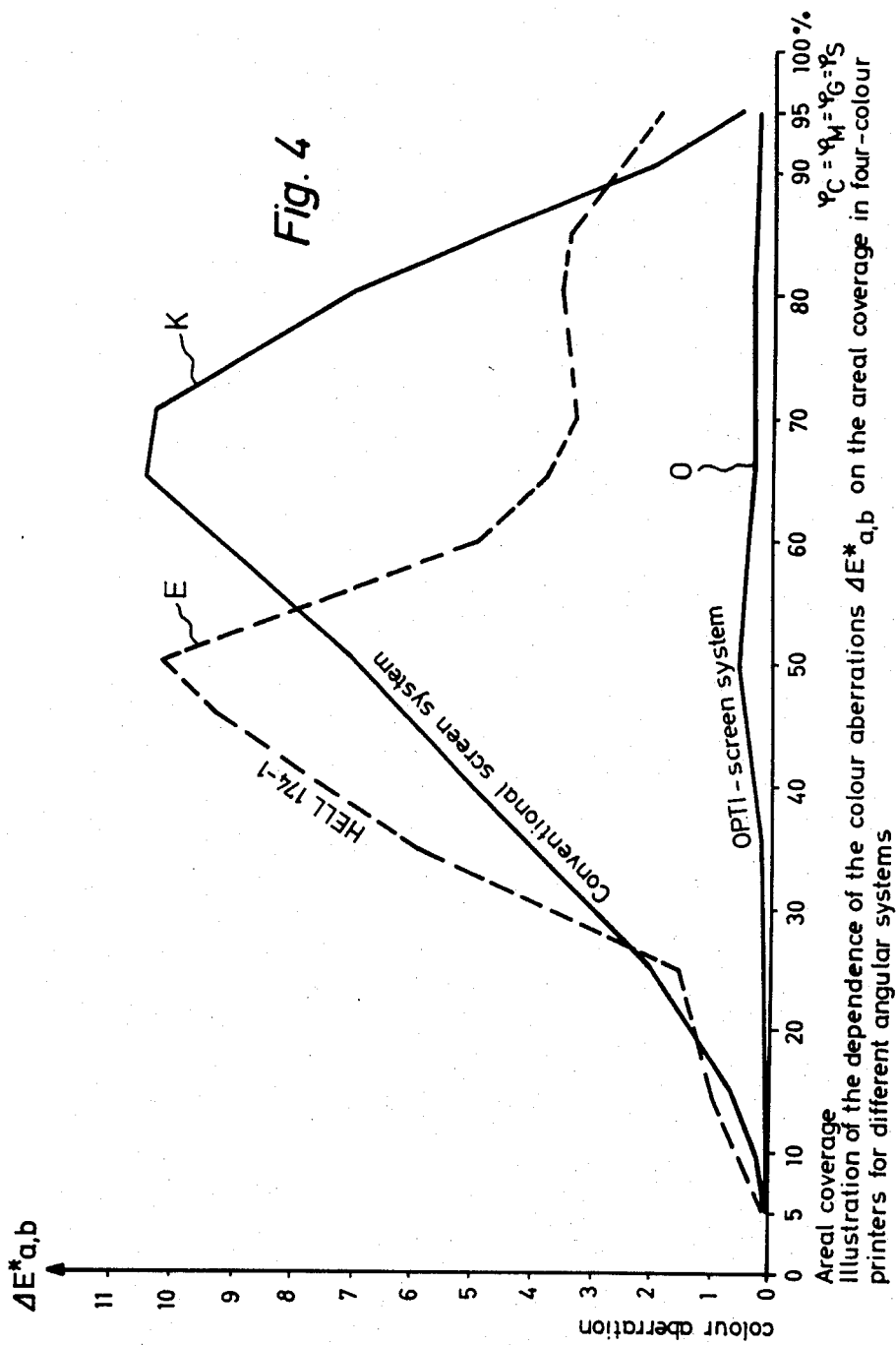

SCREEN SYSTEMS FOR MULTICOLOR PRINTING

BACKGROUND OF THE INVENTION

The present invention relates to a screen system for multicolour printing, wherein screens differing in angle and line spacing are utilised for the individual colour separations in each case.

Deviations in hue are frequently observed when printing screened colour sets in multicolor printing. These hue deviations may occur areally from one printed sheet to another. The reason is register variations between sheet and sheet, leading to systematic alterations of the screen dot coverage conditions and thus to hue fluctuations. To keep this fluctuations within limits, the individual screened colour separations are not printed in superimpositions without an angular difference, the individual screens being slewed with respect to each other.

In the case of conventional screen angles, the equiperiodic screens of the colours cyan, magneta, black are slewed through 30° with respect to each other and through 60° in the case of an elliptical dot shape, and the colour yellow is positioned between two other colours with an angular spacing of 15°. Reference is made to DIN No. 16547 in this connection. The 60° angular setting is advisable not only for the elliptical dot shapes, but also in the case of screen rulings which do not intersect each other precisely at right angles, and has thus also been included in the aforesaid DIN specification No. 16547. A Moiré effect arises if the individual angular settings are not adhered to precisely. The Moiré effect is a superimposition or interference phenomenon, noticeable by strip-shaped or areal patterns formed in the printed picture, depending on the nature of the screen. In the case of conventional angular settings, the Moiré effect is caused by the screens of the cyan, magneta and black printing colours. In the case of precise angular settings, the distance between the Moiré stripes or dots, also referred to as the Moiré period, becomes infinitely large and this is described by saying that the Moiré has been slewed out into infinity. Small angular errors reduce the Moiré period to a clearly recognisable size. The DIN specification No. 16547 makes provision for an angular precision of plus or minus 3 minutes of arc. Maintaining this angular precision during the processing steps consisting in applying the screen, assembling, copying printing plates and printing, often raises great difficulties in practice and is not always implemented for this reason. A Moiré effect is then engendered and the variations in hue thereby caused result in objections during quality control, i.e. they result in poor quality.

Even in the case of precise angular settings however, register changes between one printed sheet and another, may result in different masking ratios for the screen or half-tone dots and thus in variations in hue between one sheet and another. This phenomenon is referred to as colour variation.

A screen system different from the conventional system defined in the DIN specification has been disclosed in German Patent Specification No. 19 01 101. In this case, the forming of the screen is performed directly without a contact screen, on the colour separation film, by means of a scanner. The practical embodiment of this screen system is set forth in German Patent Specification Nos. 20 12 728 and 21 07 738 respectively, the production of the screened colour separations being effected directly on the colour separation film as already stated.

In doing so, it is of importance that the angles of the individual screens should have a rational tangent. The application of screen systems having rational tangents rendered it possible for the first time to produce screened colour separations for multicolour printing by means of drum scanners, which had otherwise been possible only by producing screen systems in conventional manner by means of contact screens or flat-bed scanners. The basis adopted in doing so was the application of screens of identical period for all angular positions, whilst introducing screens having rational tangents as already stated, and different fineness of screen. In this angled system too, the Moiré has again been slewed out into infinity, and register variations from sheet to sheet equally lead to variations in hue as in the case of conventional angular systems.

Another step was proposed in the thesis by Dr.-Ing. Helmut Schmidt, Friedrich Wilhelm Universität, Bonn, given on Apr. 30, 1975 under the title "A contribution to multicolour screen reproduction under special consideration of large-format copying screens and optimum combination between screen angles and screen lines spacings". Screens having a different degree of fineness are also intended to be utilised, but an attempt is made by combination between screen fineness and screen angles to avoid slewing the Moiré effect into infinity and merely to generate a fine Moiré effect which is intended to be unaffected by errors of angularity.

It has moreover been proposed in German Patent Specification No. OS 28 27 596 that screen systems lacking any rational tangent should also be processed by means of drum scanners. It was discovered in the meanwhile however, that although the screens proposed in the thesis by Schmidt may well be produced by means of contact screens or of this process according to German specification No. OS 28 27 596, but printing experiments have demonstrated that although no coarse Moiré effect occurs within the tolerance range, the fine Moiré effect produced nonetheless has too large a visible structure, which is why these screens are not suitable for colour image reproduction. It proved to be disadvantageous moreover that a square structure having a period of approximately 1.5 mms which is equally visible and thus has a troublesome effect is also overlaid on the fine structure during four-colour superimposition printing.

If within the scope of a practical manual investigation intended to obtain appropriate screens for four-colour screen printing, the screen periods are varied within the fineness range from 54 lines/cm to 80 lines/cm in steps of 0.005 mm, and the angles $\alpha_{1,2}$, $\alpha_{2,3}$ and $\alpha_{3,4}$ between the screens are varied by 1° steps within the range from 10° to 50°, the number of combinations which should be investigated may be calculated according to simple combinatory principles as $12 \times 12 \times 12 \times 12 \times 40 \times 40 \times 40$, amounting to 1,327,104,000 possibilities.

If three-colour printing is considered, the number of possible combinations is calculated as $12 \times 12 \times 12 \times 40 \times 40$ equalling 2,764,800 possibilities.

This demonstrates that it is impossible in this manner to find appropriate screen systems at a justifiable expense, since an experiment would have to be carried out for each combination.

It is consequently an object of the invention to establish improved screen systems for multicolour printing which are unaffected by angular distortion, i.e. systems which operate with the smallest demands regarding precision of angular displacement, as well as systems which prevent a fine Moiré effect of coarse structure to obtain the high quality required in practice and prevent the colour variation which occurs as a disadvantage of the known screen systems.

SUMMARY OF THE INVENTION

This and other objects are achieved by providing a screen system for colour reproduction wherein screens having different screen angles and line spacing from one colour separation to another are utilised in each case in the individual colour separations, wherein the screens of the screen systems assume angles with respect to each other which lie at angles selected from the ranges 19° to 24°, 25° to 29° and 32° to 36°, the tolerance range for screen fineness extending to plus or minus approximately 12% around the mean screen fineness.

BRIEF DESCRIPTION OF THE DRAWINGS

In order that the invention may be more clearly understood, reference will now be made to the accompanying drawings which are illustrative of a preferred embodiment as compared with prior art technology and in which:

FIGS. 1a and 1b show the rosette structure in conventional screen systems (state of the art), FIGS. 2a and 2b show the rosette structures in the case of an electronic screen systems (state of the art), FIG. 4 shows a comparative diagram for the dependence of the colour aberration deriving from the colour variation, on the degree of areal coverage for the different screen systems.

DETAILED DESCRIPTION OF THE PREFERRED EMBODIMENT

Figure 3A:
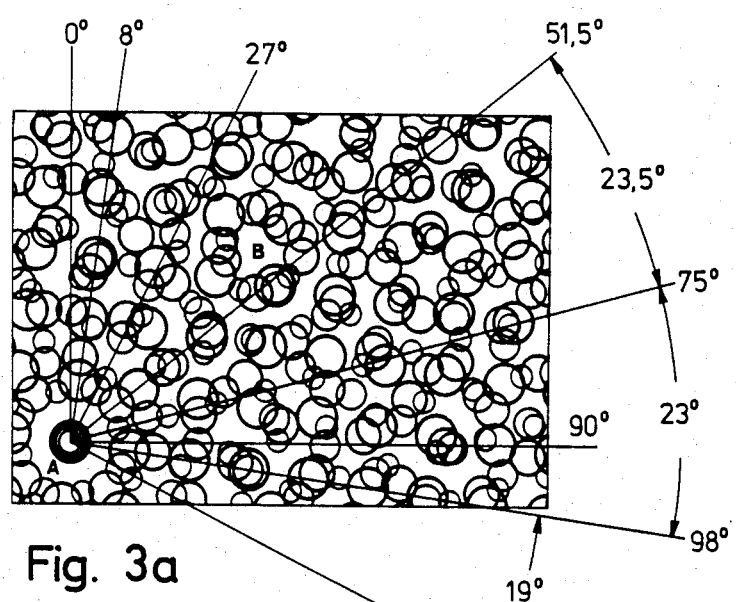
FIGS. 3a and 3b show the rosette structure in an embodiment of a screen system according to the invention.

The invention is described in particular in the following. The table below shows several screen systems which should be considered as examples in respect of the present invention. The values $d_1$, $d_2$ and $d_3$ in each case denote the screen period which should be understood as being the reciprocal of the screen fineness in lines/cm, and the values $\alpha_{1,2}$ and $\alpha_{2,3}$ denote the angles subtended between the screens, the indices 1, 2 and 3 in each case referring to one of the 3 printing screens in 3-colour printing, in which the printing operation is performed with the magenta, cyan and yellow colours.

| Screen Period | | | Angular Setting | |
|---|---|---|---|---|
| $d_1$ [mm] | $d_2$ [mm] | $d_3$ [mm] | $\alpha_{1,2}$ [o] | $\alpha_{2,3}$ [o] |
| 0.185 | 0.125 | 0.185 | 20–23 | 33–35 |
| 0.160 | 0.135 | 0.155 | 22–23 | 27–29 |
| 0.155 | 0.135 | 0.185 | 27–29 | 34–35 |
| 0.155 | 0.130 | 0.170 | 25–27 | 35–36 |
| 0.155 | 0.130 | 0.150 | 21–24 | 27–29 |
| 0.145 | 0.130 | 0.175–80 | 27–29 | 31–35 |
| 0.145 | 0.160 | 0.170 | 20–22 | 21–24 |
| 0.145 | 0.125 | 0.150 | 25–27 | 22–24 |
| 0.145 | 0.125 | 0.170 | 26–29 | 34–35 |
| 0.140 | 0.155 | 0.165 | 20–23 | 20–24 |
| 0.140 | 0.125 | 0.175 | 27–31 | 32–35 |
| 0.140 | 0.125 | 0.150 | 25–27 | 22–25 |
| 0.125 | 0.130 | 0.150 | 20–26 | 25–29 |

As will be apparent from the choice specified in this table, it is not a matter of using optional screen angles according to the present invention, the following angular ranges being applicable on the contrary:

$\alpha = 19°$ to $24°$, $25°$ to $29°$, $32°$ to $36°$.

It will also be apparent from the inventive selection, that the screen fineness combinations of the systems may partially be merged into each other by multiplication of the screen periods by a constant factor, which is advantageous inasmuch as a combination may be transformed into a required screen fineness. An example is given in the following for a conversion of this nature, which demonstrated satisfactory results in practice:

$d_1$:0.145 mm, $d_2$:0.125 mm, $d_3$:0.150 mm, $\alpha_{1,2}$:23.5° and $\alpha_{2,3}$:23°.

Firstly, the degrees of screen fineness defined thereby are considerably higher than the fineness range of around 60 lines/cm required in practice. For this reason, the screen periods are recalculated into the required range by multiplication by a constant factor. This corresponds to an enlargement of the screen system by means of a camera, in practice. The following partial versions are the result of the recalculation.

(1) maximum screen fineness 60 lines/cm, factor 1.33
$d_1 = 0.193$ mm = 51.7 L/cm
$d_2 = 0.166$ mm = 60.0 L/cm
$d_3 = 0.200$ mm = 50.0 L/cm (2) medium screen fineness 60 lines/cm, factor 1.15
$d_1 = 0.166$ mm = 60.0 L/cm
$d_2 = 0.144$ mm = 69.4 L/cm
$d_3 = 0.172$ mm = 58.0 L/cm (3) minimum screen fineness 54 lines/cm, factor 1.234568
$d_1 = 0.179$ mm = 55.9 L/cm
$d_2 = 0.154$ mm = 64.8 L/cm
$d_3 = 0.185$ mm = 54.0 L/cm Version 3 provides the best result, since it renders it possible to expect optimum qualities regarding satisfactory printability and satisfactory detail definition if the finest screen is adopted for the black printing colour.

The angular positions of the screens with respect to the zero angle are now also specified, the following screen system as a whole being proposed for 3-colour printing.

| | Screen Period | Screen fineness | Angular setting |
|---|---|---|---|
| 1st colour | 0.185 mm | 54.05 L/cm | 8° |
| 2nd colour | 0.180 mm | 55.56 L/cm | 51.5° |
| 3rd colour | 0.155 mm | 64.52 L/cm | 75° |

As is customary in screen printing, with right angled screens, the angular settings are given in the first quadrant i.e. 0° to 90° (0° being vertical, and 90° clockwise being horizontal). In a right angled screen there are always two screen lines which are at 90° to each other, and for each screen line angular setting specified in quadrant I, there is in quadrant II (90° to 180°), a second line 90° from the line in quadrant I. Thus, an angular setting of 8° also defines a line at 98° in quadrant II. Therefore, in the 3-colour example given above, the angles are 51.5°, 75°, and 98° (90°+8°), which are in the specifed ranges since 98°−75°=23°, and 75°−51.5°=23.5°.

4-colour printing is operated in a considerable extent in practice, i.e. the printing colour black is also used for printing apart from the three printing colours magneta, cyan and yellow, since a colour withdrawal had been performed as a rule in the case of the other three printing colours ("UCR"). Since the printing colour reproduced with the least contrast during printing, i.e. yellow as a rule, is least liable to form Moiré effects or rather the Moiré pattern is least visible, it is advisable to select the yellow colour as the fourth printing colour for insertion into the already proposed screen system. The following screen values are proposed for the fourth colour in the present example.

|  | Screen Period | Angular setting |
|---|---|---|
| 1. Yellow | 0.155 mm | 62° |
| 2. Yellow | 0.155 mm | 48.5° |
| 3. Yellow | 0.175 mm | 27° |

Version 3 proved to be the most satisfactory embodiment since no visible Moiré pattern is engendered in this combination by the fourth colour, i.e. the yellow screen, the following combination accordingly proving to be the best screen system for four-colour printing

| Colour | Screen Period | Screen fineness | Angular setting |
|---|---|---|---|
| Cyan | 0.185 | 54.05 L/cm | 8° (98°) |
| Magenta | 0.180 | 55.56 L/cm | 51.5° |
| Yellow | 0.175 | 57.14 L/cm | 27° (117°) |
| Black | 0.155 | 64.52 L/cm | 75° |

These angular settings fall within the specified ranges, since 117°−98°=19°, 98°−75°=23°, and 75°−51.5°=23.5°.

The correlation between colour screens may evidently be altered depending on the pattern of the original. This is frequently applied e.g. with the conventional angular settings, in the case of the printing colours cycan, magenta and black.

All the screen systems proposed according to the present invention have the advantage that they are comparatively impervious to "slewing" or angular shift, which had not been the case with all other screens except the screens proposed in the thesis by Schmidt which however, are unusable in practice. In the case of the Moiré effect blanked out by slewing into infinity, e.g. in the case of the screen corresponding to the DIN angular setting, the high precision of plus or minus 1 to 3 minutes of arc is required so that no more than one Moiré spot occurs in one reproduction. During transfer of the print original to the printing plate, i.e. during the actual printing operation, and because of uneven paper strain as between the separate printing actions, register differences occur however much act as angular setting errors and easily assume values exceeding the predetermined precision requirements. In the case of the present invention however, deviations of 1° to 2° from the specified angular setting and of plus or minus 0.020 to 0.030 mm, (or more commonly approximately plus or minus 15%) from the screen period are permissible without causing the forming of a Moiré pattern and a visible fine structure, which will be described in particular in the following.

It is a peculiarity of known screen systems that so-called rosette patterns are formed in the finished print. FIGS. 1a and 1b of the accompanying drawings show such fine structures, e.g. as occurring in the conventional screen system according to DIN 16547. The rosettes are shown without centres in FIG. 1a and with centres in FIG. 1b, the size or diameter of the dot patterns formed depending on the screen fineness. It was observed in practice that a still acceptable but noticeable fine structure results with a screen fineness of approximately 60 lines/cm. Coarser screens result in unacceptable fine structures, as is also the case for the screen specified in the thesis by Schmidt.

The dot patterns of the fine or detail structure also resulting for the electronic screen system according to the hereinabove referred to method according to German Patent Specification Nos. 19 01 101, 20 12 728 and 21 07 738, are depicted in FIGS. 2a and 2b. In this case, the screen for the colour black has been displaced through half a screen grid element diagonal in FIG. 2b. The screen angles utilised are illustrated as fine lines in FIGS. 1a and 1b and 2a and 2b. As apparent from FIGS. 1a and 1b, and 2a and 2b, different masking or covering conditions of the screen dots of the separate screen grids are to be found in these detail structures after the printing operation. This is the reason for fluctuations in hue which are also referred to as colour variations. It was observed in practice that the conventional screen systems of FIGS. 1a and 1b, as well as the electronic screen systems according to FIGS. 2a and 2b, have a significant colour deviation or variation since the areas of overlap in the separate part colours vary locally during superimposition printing and are repeated periodically as shown by the corresponding Figures.

In purely theoretical manner, this colour variation may be prevented by selecting a dot distribution complying with the formulae of Neugebauer (Thesis, 1935), since the latter proposed a statistical probability for calculation of the areas of overlap of the separate part colours during superimposition printing.

Figure 3B:
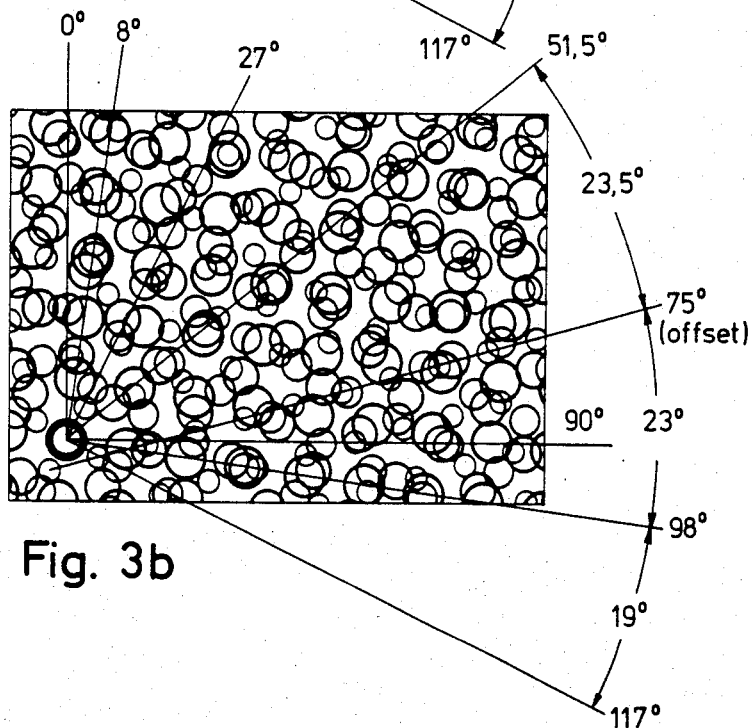

As shown by FIGS. 1a and 1b, as well as 2a and 2b, it proved to be impossible until now to specify screen systems fulfilling this requirement. FIGS. 3a and 3b however show that it is possible in accordance with the present invention to obtain substantially more favourable conditions regarding the colour variation in the case of the screen structures specified, in which connection it became apparent that the mean tonal value errors correspond to the calculations according to the Neugebauer formulae, within a margin of plus or minus 0.2%. The comparison of the Figures thus shows that the detail structure has a much lower regularity in the inventive screen systems. At the same time, this means that the coincidence between the screen dots of the separate screens has a substantially greater number of accidentally caused fine or detail structures and is thus less affected by colour variation, since the existing residual effect operates far below the perceptive capacity of the human eye.

FIG. 4 shows a graphic illustration depicting a confrontation in respect of the colour aberration deriving from the possible colour deviation as a function of the degree of areal coverage, for the conventional screen system K according to the aforesaid DIN standard, the electronic screen system E and the inventive screen system O. The fluctuation in hue may for example be engendered by displacing the black screen through half a screen grid element diagonal. As will be understood, the inventive screen system provides a substantially smaller colour aberration within the range of the proportion of areal coverage from 5 to 95%.

Let it be mentioned too, that the screen systems of the present invention may be applied in different forms in practice, be it as so-called copying or contact screens during the production of printing blocks for the different printing processes, in the form of an electronic screen system in the case of electronic colour extraction production or in another optional form in which such screen systems may be utilised for colour image reproduction.

I claim:

1. A screen system for color reproduction comprising first, second, and third screens of different colour separations each having different screen angles and line spacings, said screens having lines which lie at successive angles selected from the ranges of 19° to 24°, 25° to 29°, and 32° to 36°, as measured in a common direction from the first screen to the second screen, and from the second screen to the third screen, the tolerance range for screen fineness extending to plus or minus approximately 12% of the mean screen fineness.

2. A screen system according to claim 1 wherein the colours of said screens comprise colours more visible than yellow, and said screen system further comprises a yellow fourth screen having lines at an angle within said ranges to the lines of one of the first, second, and third screens.

3. A screen system according to claim 2 wherein the colours of the first, second, and third screens are magenta, cyan, and black.

4. A screen system according to claim 3 wherein the screen for one colour has a fineness of 54.0 lines/cm and an angle of 98° with respect to a zero direction, the screen for a second colour has a screen fineness of 55.56 lines/cm and an angle of 51.5° with respect to the zero direction, and the screen for a third colour has a screen fineness of 64.52 lines/cm and an angle of 75° with respect to the zero direction, and the screen system has an angular tolerance range between 1° and 2°.

5. A screen system according to claim 4 wherein the fourth yellow screen has a screen fineness of 64.52 lines/cm and an angle of 62° with respect to the zero direction.

6. A screen system according to claim 4 wherein the fourth yellow screen has a screen fineness of 64.52 lines/cm and angle of 48.5° with respect to the zero direction.

7. A screen system according to claim 4 wherein the fourth yellow screen has a screen fineness of 57.14 lines/cm and an angle of 117° with respect to the zero direction.

8. A screen system according to claim 1 wherein the successive angles are between about 23° and 23.5°, and the screen system has an angular tolerance range of between about 1° and 2°.

9. A screen system for colour reproduction comprising first, second, and third screens of different colour separations having different screen angles and line spacings, said screen system comprising one of the sets of screen periods and the corresponding angular settings of the following table:

| Screen Period | | | Angular Setting | |
|---|---|---|---|---|
| $d_1$ | $d_2$ | $d_3$ | $\alpha_{1,2}$ | $\alpha_{2,3}$ |
| 0.185 | 0.125 | 0.185 | 20–23 | 33–35 |
| 0.160 | 0.135 | 0.155 | 22–23 | 27–29 |
| 0.155 | 0.135 | 0.185 | 27–29 | 34–35 |
| 0.155 | 0.130 | 0.170 | 25–27 | 35–36 |
| 0.155 | 0.130 | 0.150 | 21–24 | 27–29 |
| 0.145 | 0.130 | 0.175–80 | 27–29 | 31–35 |
| 0.145 | 0.160 | 0.170 | 20–22 | 21–24 |
| 0.145 | 0.125 | 0.150 | 25–27 | 22–24 |
| 0.145 | 0.125 | 0.170 | 26–29 | 34–35 |
| 0.140 | 0.155 | 0.165 | 20–23 | 20–24 |
| 0.140 | 0.125 | 0.175 | 27–31 | 32–35 |
| 0.140 | 0.125 | 0.150 | 25–27 | 22–25 |
| 0.125 | 0.130 | 0.150 | 20–26 | 25–29 | where $d_1$, $d_2$, and $d_3$ are the screen periods of the first, second, and third screens respectively, $\alpha_{1,2}$ is the angle between the lines of the first screen and the second screen, and $\alpha_{2,3}$ is the angle between the lines of the second screen and the third screen, measured in the same direction as the angle between the lines of the first screen and the second screen.

* * * * *